(12) United States Patent
Yuasa

(10) Patent No.: US 9,217,776 B2
(45) Date of Patent: Dec. 22, 2015

(54) BATTERY INSPECTION APPARATUS

(71) Applicant: Sumitomo Heavy Industries, Ltd., Tokyo (JP)

(72) Inventor: Hideaki Yuasa, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 451 days.

(21) Appl. No.: 13/680,576

(22) Filed: Nov. 19, 2012

(65) Prior Publication Data
US 2013/0141107 A1 Jun. 6, 2013

Related U.S. Application Data

(63) Continuation of application No. PCT/JP2011/002679, filed on May 13, 2011.

(30) Foreign Application Priority Data

May 19, 2010 (JP) ................................ 2010-115622

(51) Int. Cl.
*G01N 27/416* (2006.01)
*G01R 31/36* (2006.01)

(52) U.S. Cl.
CPC ........ *G01R 31/3606* (2013.01); *G01R 31/3624* (2013.01); *G01R 31/3696* (2013.01)

(58) Field of Classification Search
CPC ........... G01R 31/3648; G01R 31/3627; G01R 31/3662; G01R 31/3631; Y02E 60/12
USPC ........................................................ 324/426
See application file for complete search history.

(56) References Cited

U.S. PATENT DOCUMENTS

| 5,710,503 A * | 1/1998 | Sideris et al. ................. 324/431 |
| 2007/0120537 A1* | 5/2007 | Yamamoto .................... 320/150 |
| 2011/0080143 A1* | 4/2011 | Parakulam et al. ........... 320/162 |

FOREIGN PATENT DOCUMENTS

| JP | 10-253726 A | 9/1998 |
| JP | 2002-078229 A | 3/2002 |

(Continued)

OTHER PUBLICATIONS

International Search Report issued in PCT/JP2011/002679, mailing date Aug. 9, 2011, and translation thereof (5 pages).

(Continued)

*Primary Examiner* — Arun Williams
(74) *Attorney, Agent, or Firm* — Buchanan Ingersoll & Rooney PC

(57) ABSTRACT

A battery inspection apparatus includes: a battery inspection table having a plurality of inspection units each for inspecting a rechargeable battery; and a controller that is provided separately from the battery inspection table and configured to control the battery inspection table. Each of the inspection units includes: a contactor for inspection configured to contact a corresponding battery; and a measurement circuit that is connected to the contactor and configured to generate an analog measured signal by measuring at least one of a current, voltage, and temperature, based on an input from the contactor. The battery inspection table has a control board mounted, the control board being configured to convert the analog measured signal generated by each of the inspection units into a digital signal to output to a common communication cable, and the communication cable connects the control board and the controller together.

5 Claims, 6 Drawing Sheets

(56) References Cited

FOREIGN PATENT DOCUMENTS

| JP | 2004-119327 A | 4/2004 |
| JP | 2004-319334 A | 11/2004 |
| JP | 2008-189065 A | 8/2008 |

OTHER PUBLICATIONS

International Preliminary Report on Patentability issued in PCT/JP2011/002679, mailing date Dec. 10, 2012, and translation thereof (10 pages).

Patent Abstract for Japanese Publication No. 2004-319334 published Nov. 11, 2004 (1 page).
Patent Abstract for Japanese Publication No. 2008-189065 published Aug. 21, 2008 (1 page).
Patent Abstract for Japanese Publication No. 10-253726 published Sep. 25, 1998 (1 page).
Patent Abstract for Japanese Publication No. 2004-119327 published Apr. 15, 2004 (1 page).
Patent Abstract for Japanese Publication No. 2002-078229 published Mar. 15, 2002 (1 page).

* cited by examiner

BATTERY INSPECTION APPARATUS

RELATED APPLICATIONS

This application is a continuation of and claims priority to PCT/JP 2011/002679 filed on May 13, 2011, which claims the benefit of and priority from Japanese Patent Application No. 2010-115622 filed on May 19, 2010, the entire contents of these applications are incorporated herein by reference.

BACKGROUND

1. Technical Field

The present invention relates to a battery inspection apparatus for inspecting a rechargeable battery.

2. Description of the Related Art

In Japanese Unexamined Patent Publication No. 2004-319334, a charge/discharge and inspection system of flat batteries are described. In this system, charge/discharge of a large number of second batteries and inspection for the batteries are collectively performed by arraying the batteries side by side in a battery housing container to connect electrodes to each of the batteries.

SUMMARY

A battery inspection apparatus according to an embodiment of the present invention includes: a battery inspection table having a plurality of inspection units each for inspecting a rechargeable battery; and a controller that is provided separately from the battery inspection table and configured to control the battery inspection table. Each of the inspection units includes: a contactor for inspection configured to contact a corresponding battery; and a measurement circuit that is connected to the contactor and configured to generate an analog measured signal by measuring at least one of a current, voltage, and temperature, based on an input from the contactor. The battery inspection table has at least one communication unit mounted therein, the communication unit being configured to convert the analog measured signal generated by each of the inspection units into a digital signal to output to a common digital communication line, and the digital communication line connects the communication unit and the controller together.

BRIEF DESCRIPTION OF THE DRAWINGS

Embodiments will now be described, byway of example only, with reference to the accompanying drawings, which are meant to be exemplary, not limiting, and wherein like elements are numbered alike in several figures, in which.

DETAILED DESCRIPTION

Figure 1:
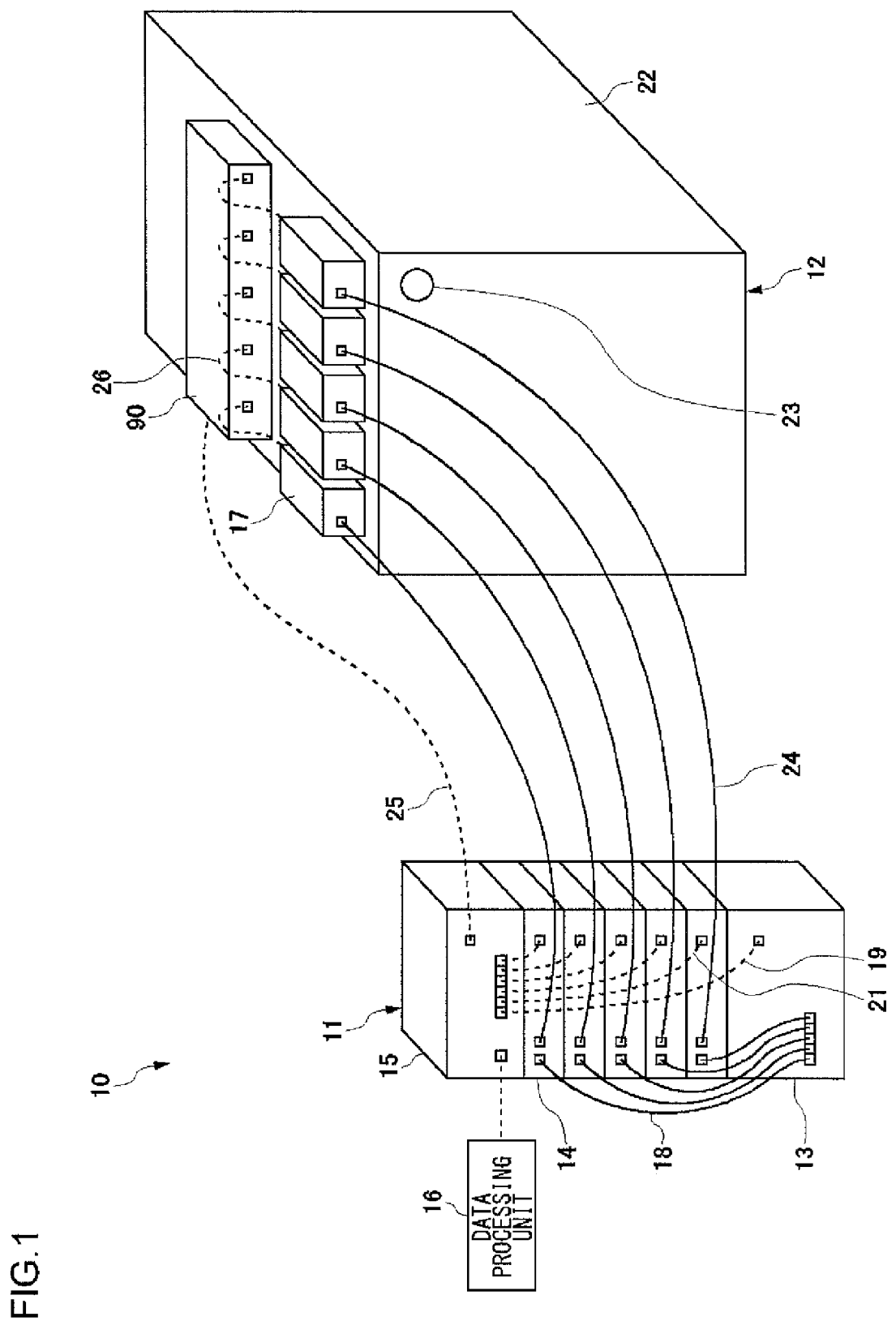
FIG. 1 is a view schematically illustrating the whole structure of a battery inspection apparatus according to an embodiment of the present invention.

The invention will now be described by reference to the preferred embodiments. This does not intend to limit the scope of the present invention, but to exemplify the invention.

In a battery inspection apparatus, an electric power device for supplying power to an inspection table in which batteries are inspected, is generally provided separately from the inspection table. This electric power device is used for generating a voltage or current, which is necessary for the inspection, and for supplying it to each battery. When a large number of battery inspection places are provided in the inspection table in order to collectively inspect a large number of batteries, wirings through which electric power is to be supplied and inspection results are to be collected are connected to each of the battery inspection places from the electric power device. Accordingly, the wirings between the electric power device and the inspection table are likely to be huge in the number thereof and be complicated. As a result, the ratio of the cost for the wirings to the production cost for the whole apparatus becomes large. Therefore, it is desirable in an embodiment of the present invention to provide a battery inspection apparatus in which the number of wirings can be reduced.

According to an embodiment of the present invention, measurement results obtained from the plurality of inspection units can be transmitted to the controller through the common digital communication line. Accordingly, it is not needed to provide an individual communication line for every inspection unit, and hence the number of the wirings in the battery inspection apparatus can be reduced. Further, because the analog measured signal is converted into a digital signal to be transmitted, an influence by a noise possibly added to a signal in a communication channel can be suppressed, thereby allowing the measurement results to be sent to the controller in a good state.

A battery inspection apparatus according to an embodiment of the present invention outputs, through a common communication line, measured data representing measurement results obtained in a battery inspection table. A plurality of inspection units in the battery inspection table are divided into groups, and one communication unit is mounted, for every group, in the battery inspection table. In one example, the communication unit is a remote I/O. The single communication unit may be mounted in the battery inspection table. In this case, it is assumed that all of the inspection units in the inspection table are included in a single group. The common communication line connects the communication units in the battery inspection table to a controller in an electric power device provided separately from the battery inspection table. Alternatively, instead of the controller in the electric power device, the communication units may be connected to a controller including a data processing device, etc., provided separately from the battery inspection table, or a memory device for collecting and storing the measurement results.

In the battery inspection apparatus according to an embodiment of the present invention, an electric power device provided separately from the battery inspection table provides an output voltage at an intermediate level to the battery inspection table, instead of providing a charge-discharge voltage matched to an inspection specification. Accordingly, a voltage controller is mounted in the battery inspection table to adjust the intermediate output voltage provided by the electric power device to the charge-discharge voltage matched to the inspection specification. That is, the voltage controller for generating a voltage for inspection, which has been separated from the electric power device, is mounted in the inspection table.

In one example, the electric power device may include: a regeneration unit for receiving power from an external power source when a battery is charged, and for returning power to the external power source when the battery is discharged; a plurality of power units each connected to the regeneration unit to output an intermediate output voltage; and a case for housing the regeneration unit and the power units. A plurality of buck-boost converters mounted in the inspection table may be connected to the power units in the electric power device. That is, the regeneration unit may be connected to the plurality of the power units and each of the plurality of the power units may be connected to the plurality of the buck-boost converters. Thus, the power system in a battery inspection system may have a so-called dendrogram-like wiring connection structure in which the plurality of the power units are connected to one regeneration unit and a large number of the buck-boost converters are connected to the plurality of the power units. The large number of the buck-boost converters are provided for every inspection unit and connected to a corresponding inspection unit.

According to an embodiment of the present invention, the battery inspection apparatus is formed so as to connect the electric power device and the inspection table together in an intermediate level in the dendrogram. Accordingly, the plurality of the buck-boost converters are formed as a buck-boost unit in the inspection table, and the buck-boost unit and the power unit in the electric power device that correspond to the buck-boost unit are connected together by a power line. With such a structure, the number of the wirings in the battery inspection apparatus can be reduced to the number of the wirings proportional to the number of the buck-boost units from the number of the wirings proportional to the number of the inspection units. The cost for the wirings can also be reduced. Further, the electric power device can be made compact. The present embodiment is effective particularly when a battery inspection system including a large number of the battery inspection apparatuses is formed.

That is, the plurality of the inspection units in the battery inspection table are divided into groups, and one buck-boost unit is mounted, for every group, in the battery inspection table. The grouping in this power system may be different from that in the aforementioned communication system. For example, the number of the buck-boost units mounted in the battery inspection table may be made different from that of the communication units by collecting, into a group, the inspection units whose number in the power system is different from that of the inspection units in the communication system.

In a typical battery inspection apparatus, a power supply system is designed such that connection wirings between buck-boost converters and inspection units, the connection wirings corresponding to the end of a dendrogram, are made to be connection wirings between an electric power device and an inspection table. A large number of the buck-boost converters are provided correspondingly to a large number of the inspection units for collectively inspecting a large number of batteries. Accordingly, it is said that a huge number of wirings are needed. Similarly, wirings for sending measurement results obtained by the inspection units are also pulled out from each of the large number of the inspection units to the electric power device or a controller. A layout for installing the battery inspection apparatus can be constrained in order to make the huge number of the wirings to be as short as possible. Also, the electric power device becomes large in size to provide the large number of the buck-boost converters and connection terminals.

In addition, in the typical inspection apparatus, each of the large number of the inspection units is connected directly to the electric power device or the controller by analog communication lines. Because these analog communication lines and power lines are often installed by being pulled out in a similar way, a noise is likely to be added to an analog measured signal with a magnetic field, caused by current flowing through the power lines, interfering with the analog communication lines. Accordingly, there is the fear that the reliability of a received signal may be adversely affected by the noise. Also, as the analog communication line is made longer, the reliability of a signal may be more deteriorated due to a decrease in a voltage in the communication line itself.

Figure 2:
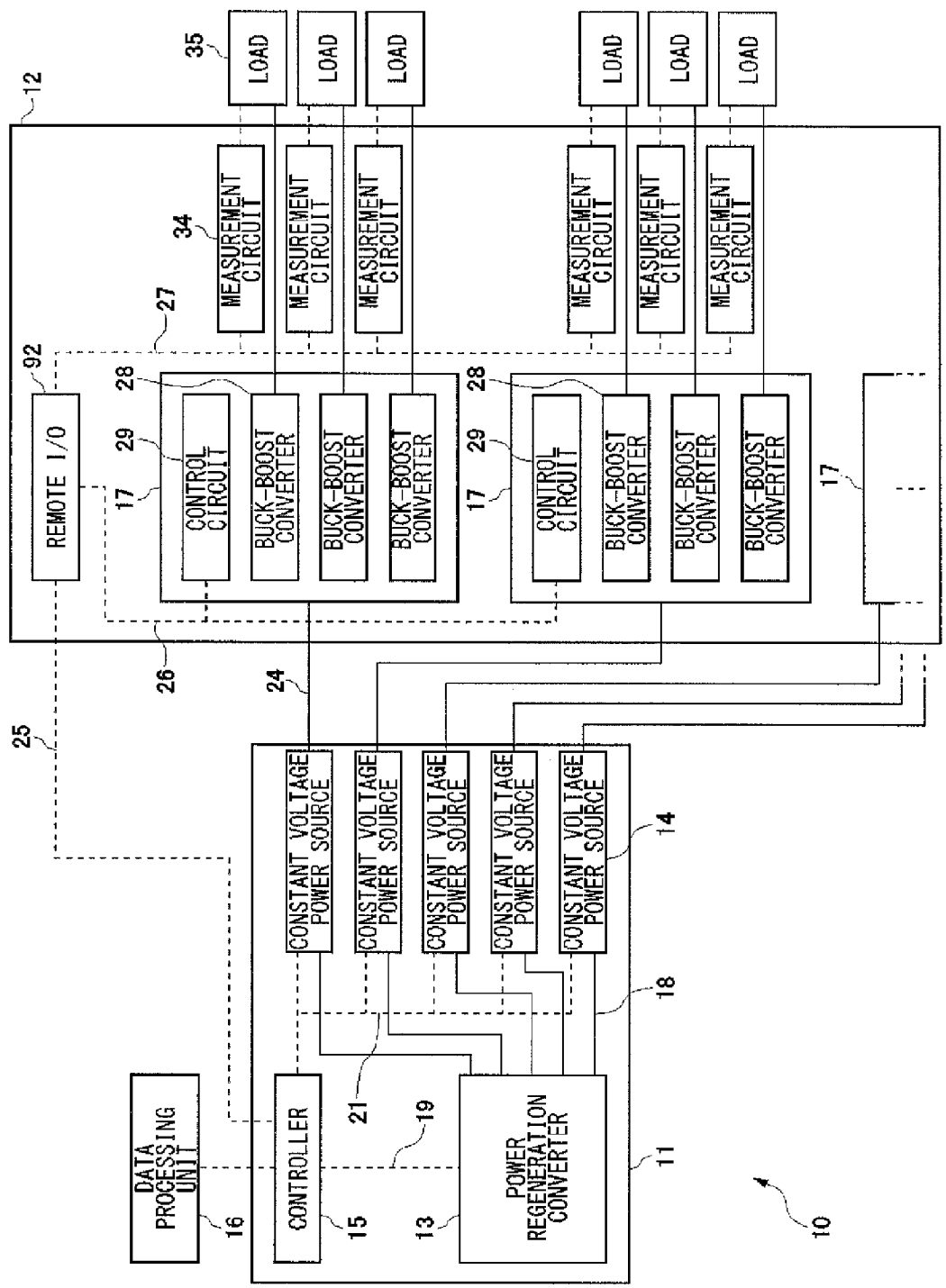
FIG. 2 is a block view schematically illustrating a power system and a communication control system in the battery inspection apparatus according to an embodiment of the invention.

FIG. 1 is a view schematically illustrating the whole structure of a battery inspection apparatus 10 according to an embodiment of the present invention. FIG. 2 is a block view for explaining a power system and a communication control system in the battery inspection apparatus 10 according to an embodiment of the invention. The battery inspection apparatus 10 is a charge-discharge test apparatus formed such that a large number of secondary batteries are charged and discharged to be collectively inspected. In FIGS. 1 and 2, the power system and communication control system in the battery inspection apparatus 10 are schematically illustrated. In the views, the solid lines each connecting respective elements represent power lines, and the dashed lines represent communication control lines.

The battery inspection apparatus 10 is formed to include an electric power device 11 and a battery inspection table 12. The electric power device 11 and the battery inspection table 12 are respectively formed as devices separate from each other, and connected to each other by a connection cable. The connection cable includes the power line and the control line. The electric power device 11 and the battery inspection table 12 may be installed, for example, adjacently or closely to each other. Alternatively, the electric power device 11 may be installed to be spaced apart from the battery inspection table 12. According to the present embodiment, the number of the connection wirings between the electric power device 11 and the battery inspection table 12 can be reduced, as described later, and hence it becomes easy to install the electric power device 11 and the battery inspection table 12 so as to be spaced apart from each other. Accordingly, flexibility of a layout for installing the battery inspection apparatus 10 is enhanced.

In one example, a battery inspection system including a plurality of the battery inspection apparatuses 10 may be formed in a factory, and a power source zone where a plurality of the electric power devices 11 are installed and an inspection zone where a plurality of the inspection tables 12 are installed may be distinguished from each other. An automatic conveyance system for conveying batteries into and out of the inspection tables 12 may be installed in the inspection zone. The power source zone may be provided in a room different from that of the inspection zone, and may be provided in, for example, a dedicated power source room. According to the one example of the present invention, the electric power device 11 can be miniaturized, and hence the power source room can be miniaturized. Accordingly, air conditioning of the power source room can be easily performed. That is, the environmental temperature around the electric power device 11 can be adjusted with saved energy.

The electric power device 11 is formed to include a power regeneration converter 13, a constant voltage power source 14, and a controller 15. The power regeneration converter 13 relays an external power source (not illustrated) to the constant voltage power source 14. The external power source is, for example, a commercial power source, such as an alternating-current source to be used industrially. The power regeneration converter 13 functions as a power receiving circuit that receives power from the external power source, when batteries to be inspected in the inspection table 12 are charged; and functions so as to return power to the external power source, when the batteries are discharged. The power regeneration converter 13 is provided as a power regeneration converter common among a plurality of the constant voltage power sources 14.

The constant voltage power source 14 adjusts the power supplied from the external power source via the power regeneration converter 13 to output it. For convenience, an output of the constant voltage power source 14 is hereinafter referred to as an intermediate output. The constant voltage power source 14 is formed such that a plurality of intermediate outputs can be generated. That is, the constant voltage power source 14 has a plurality of channels (e.g., several or more channels). Each of buck-boost converters 28 in a buck-boost unit 17 is connected to each of the channels (see FIG. 2). The intermediate output is supplied to the buck-boost unit 17 mounted in the inspection table 12. The intermediate output has a voltage and a current higher than the voltage and the current that are matched to an inspection specification of a battery. The constant voltage power source 14 is, for example, a DC-DC converter, and is preferably an isolated bidirectional DC-DC converter.

A plurality of the constant voltage power sources 14 are provided, each of which is connected to the power regeneration converter 13 by a DC link line 18. The DC link lines 18 whose number corresponds to that of the constant voltage power sources 14 are provided. In the illustrated example, five constant voltage power sources 14 are provided, and hence five DC link lines 18 are provided, the numbers of the constant voltage power sources 14 and the DC link lines 18 being equal to each other. Each of the constant voltage power sources 14 receives power from the power regeneration converter 13 through the DC link line 18, when a battery to be inspected is charged; and supplies power to the power regeneration converter 13 through the DC link line 18, when the battery is discharged.

The controller 15 is formed so as to control the battery inspection table 12, the power regeneration converter 13, and the constant voltage power source 14. The controller 15 and the power regeneration converter 13 are connected together by a first communication control line 19, and the controller 15 and the constant voltage power source 14 are connected together by a second communication control line 21. The second communication control lines whose number corresponds to the number of the constant voltage power sources 14 are provided. The first communication control lines 19 and the second communication control lines 21 are provided separately from the DC link lines 18.

The power regeneration converter 13, the constant voltage power source 14, and the controller 15 are housed in an electric power device enclosure (not illustrated). The electric power device enclosure has, for example, a rack or a frame structure, by which a rectangular parallelepiped-shaped internal space for housing the power regeneration converter 13, the constant voltage power source 14, and the controller 15 is defined.

The electric power device enclosure houses: the power regeneration converter 13 in the lower portion; the controller 15 in the upper portion; and a plurality of the constant voltage power sources 14 between the power regeneration converter 13 and the controller 15. The power regeneration converter 13, the constant voltage power source 14, and the controller 15 are housed by being arrayed in the vertical direction (i.e., in a direction perpendicular to the floor surface) in the electric power device enclosure. Accordingly, the occupied floor area (so-called footprint) of the electric power device 11 can be reduced. The footprint of the electric power device 11 can be reduced to a size almost equal to or smaller than that of the inspection table 12. Alternatively, the power regeneration converter 13, the constant voltage power source 14, and the controller 15 may be arrayed, in the electric power device enclosure, in an order different from the illustrated order.

A data processing unit 16 is connected to the controller 15. The data processing unit 16 collects, via the controller 15, measured data obtained in the inspection table 12, such as a voltage, current, and temperature in a battery, to store them. The data processing unit 16 processes the collected data to output them by using an attached output means, such as a display, printer, or the like. The data processing unit 16 is, for example, a publicly-known personal computer. The controller 15 and the data processing unit 16 are connected together by a publicly-known method, such as, for example, an LAN.

The inspection table 12 is formed to include: an inspection stage on which a large number of batteries to be inspected are arrayed in a matrix; and a probe mechanism having a contactor, for example, a probe, which is used for inspecting the batteries. The probe mechanism has a large number of the probes provided in an array corresponding to the matrix array of the inspection units. That is, the battery inspection table 12 includes: an inspection stage on which mounting portions are arrayed in a matrix in order to hold a larger number of batteries; and a contactor array in which the contactors are arrayed in an array corresponding to the matrix array of the mounting portions.

Mounting positions for batteries are defined as the mounting portions in the inspection units in the battery inspection table. Each of the inspection units includes: a probe for inspection to contact a battery to be inspected; and a measurement circuit 34 for generating an analog measured signal by measuring at least one of a current, voltage, and temperature, based on an input from the probe. In battery inspection table 12, the communication unit (e.g., remote I/O 92) is installed at a position opposite to that of the inspection stage so as to sandwich the contactor array. The communication unit and the contactor array are arranged on the same side, when viewed from the inspection stage. That is, the communication unit is arranged behind the probe mechanism, when viewed from the inspection stage. The measurement circuit 34 is arranged between the contactor array and the communication unit.

Figure 3:
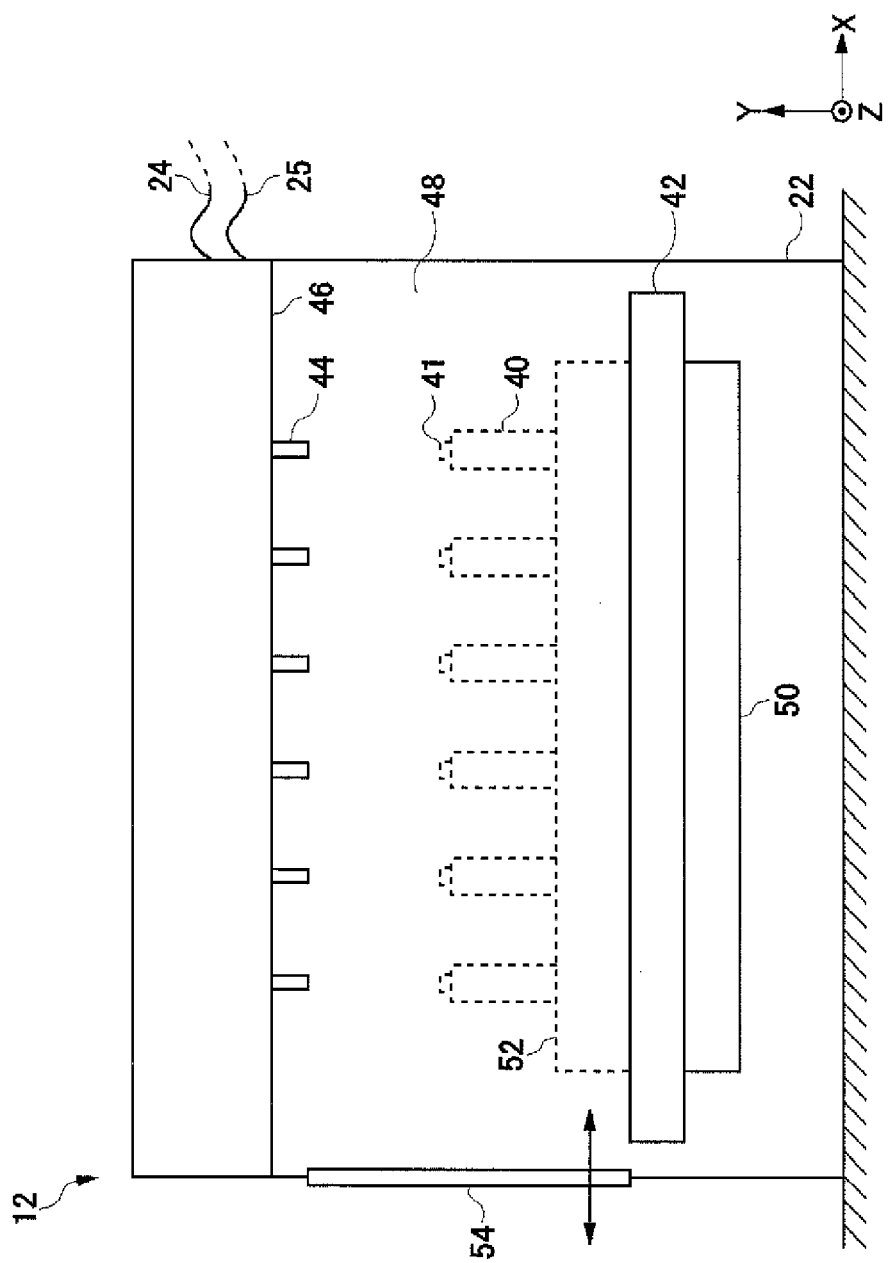
FIG. 3 is a view schematically illustrating a substantial portion of a battery inspection table according to an embodiment of the invention.
Figure 4:
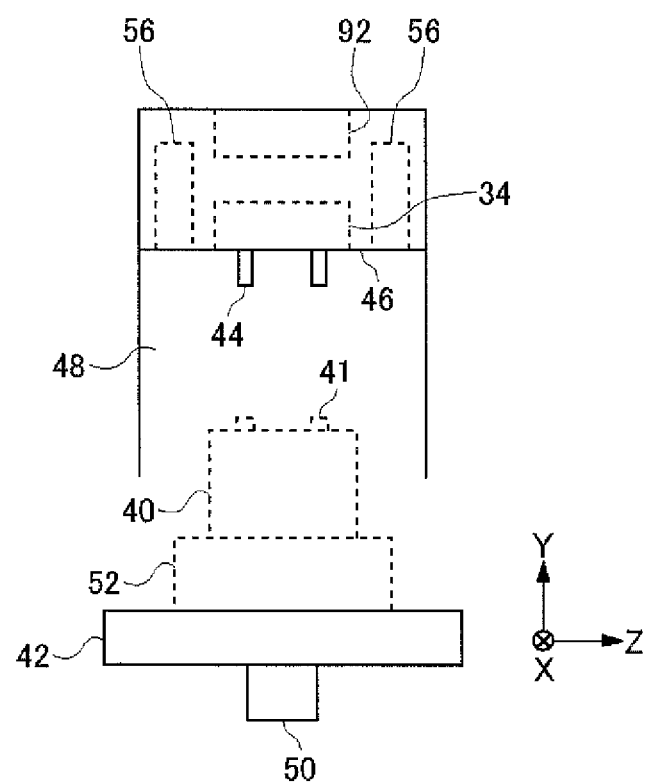
FIG. 4 is a view schematically illustrating the substantial portion of the battery inspection table according to an embodiment of the invention.

With such a structure, the devices in the battery inspection table 12 are arranged in the order of the contactor array, the measurement circuit 34, and the communication unit from the side of the inspection stage. For example, as illustrated in FIGS. 3 and 4, a contactor 44, a contactor supporting portion 46, the measurement circuit 34, and an electric component 56 including the remote I/O 92 are arranged, in this order, toward outside from a battery supporting portion 42 on which a battery is to be mounted. Thus, the measurement circuit 34 can be arranged closely to the communication unit. In one example, a control board 90, on which the communication unit and the measurement circuit 34 are mounted and electrically connected together, may be provided in the battery inspection table 12. With such a structure, the length of the wiring between the measurement circuit 34 and the communication unit can be minimized.

The inspection table 12 may include a transfer mechanism by which the inspection stage and the probe mechanism are moved relatively to each other such that the probe contacts and leaves a battery. In the inspection stage, a large number of batteries (e.g., several tens or more batteries) are arrayed in a matrix along a plane perpendicular to the vertical direction (e.g., a plane parallel to the floor surface). In this case, the transfer mechanism provides a vertical relative movement between the inspection stage and the probe mechanism.

The inspection stage and the probe mechanism are housed in a case 22 of the inspection table 12. The case 22 is formed into a rectangular parallelepiped shape, and an emergency stop switch 23 is provided on the side surface thereof. When an operator operates the emergency stop switch 23 in case of emergency, the movement of the battery inspection apparatus 10 can be stopped. Alternatively, the emergency stop switch 23 may be provided in the electric power device 11 or provided in each of the electric power device 11 and the inspection table 12.

A plurality of the buck-boost units 17 (in the view, five buck-boost units) and the control board 90 are mounted in the inspection table 12. The buck-boost units 17 and the control board 90 are installed on the upper surface of the case 22. The remote I/O 92 (see FIG. 2) is housed in the control board 90. The remote I/O 92 is connected to the controller 15 by a communication cable 25. Because the remote I/O itself is a publicly-known device, the detailed description of the structure thereof will be omitted. The communication cable 25 is a digital communication line through which multi-channel synchronous communication can be achieved. Transmission and reception of control commands from the electric power device 11 to the inspection table 12 and transmission of measured data from the inspection table 12 to the electric power device 11 are performed through the communication cable 25.

Each of the buck-boost units 17 is connected directly to the constant voltage power source 14 by a power cable 24. The power cable 24 is, for example, a four-core cable including a ground wire. Each of the buck-boost units 17 is connected to the remote I/O 92 by a communication line 26. The number of the buck-boost units 17 is equal to that of the constant voltage power sources 14, and the power cables 24 whose number is also equal to that of the constant voltage power sources 14 are provided. The buck-boost units 17 may be housed in the control board 90. Alternatively, a control power module for operating the buck-boost units 17 (not illustrated) may be provided in the control board 90.

In one example, the buck-boost units 17 can be provided, in the case 22 of the inspection table 12, in a compartment different from an inspection stage compartment where the inspection stage is arranged. Because the buck-boost units 17 need relatively large power, they can be provided to be spaced apart from the inspection units in the inspection table 12. For example, the buck-boost units 17 can be provided at the end of the inspection table 12. The above arrangement will be effective as a measure, when it is assumed that an inflammable gas may possibly leak out of a defective battery, of the batteries to be inspected. In this case, the buck-boost units 17 can be provided at the upper end or the lower end of the inspection table 12 in order to maintain the footprint of the inspection table 12. Also, in one example, an exhaust device for discharging the inflammable gas outside, such as a fan, may be provided in the inspection stage compartment where the inspection stage is arranged.

In one example, the case 22 has a structure in which the internal space thereof is closed from the external space to hold housed objects so as not to be seen from outside, as illustrated. The case 22 includes a wall portion and a door portion (not illustrated) for defining the internal space. Alternatively, the case 22 may have a structure in which housed objects are opened to outside to be able to be seen from outside. Alternatively, the case 22 may have a rack, a frame body, a frame structure, or the like.

As illustrated in FIG. 2, each of the buck-boost units 17 mounted in the inspection table 12 includes the plurality of the buck-boost converters 28 and a control circuit 29 for controlling these buck-boost converters 28. The buck-boost unit 17 includes an electric substrate on which electronic circuits, equivalent to the plurality of the buck-boost converters 28 and the control circuit 29, are formed. The control circuit 29 is connected to the remote I/O 92 through the communication line 26. The buck-boost units 17 includes, at a maximum, the buck-boost converters 28 whose number is equal to that of the channels of the constant voltage power sources 14. The buck-boost unit 17 preferably includes the buck-boost converters 28 whose number is equal to that of the channels of the constant voltage power sources 14. The plurality of the buck-boost converters 28 included in the buck-boost unit 17 are connected to the corresponding constant voltage power source 14 by the common power cable 24.

The buck-boost converters 28, whose number is, in total, equal to the number of the inspection units on the inspection stage, are provided in the inspection table 12. That is, one buck-boost converter 28 is matched to every inspection unit, and hence the buck-boost converters 28 whose number is equal to that of the inspection units are provided. The buck-boost converter 28 adjusts an intermediate output, which is inputted from the constant voltage power source 14 through the power cable 24, to a voltage and current matched to an inspection specification. An output of the buck-boost converter 28 is provided to a load 35 through each of the probes in the probe mechanism and is used for inspection. The load 35 is a secondary battery to be inspected, and, for example, a battery cell.

The measurement circuit 34 is provided correspondingly to each inspection unit. The measurement circuit 34 is associated with the inspection unit and installed in or around it. The measurement circuit 34 measures a state of the load 35, based on an input from each of the probes. The measurement circuit 34 includes at least one of a temperature measurement circuit, a voltage measurement circuit, and a current measurement circuit to measure at least one of the temperature, voltage, and current in the load 35. The measurement circuit 34 is formed as an analog sensor for generating an analog measured signal indicating the state of the load 35.

The measurement circuit 34 and the remote I/O 92 are connected together by an analog communication line 27. The analog communication line 27 is provided correspondingly to each of the measurement circuits 34, and outputs of a plurality of the measurement circuits 34 are inputted to the remote I/O 92. As illustrated in FIG. 2, one remote I/O 92 may be provided in the inspection table 12 such that outputs of all of the measurement circuits 34 are inputted to the remote I/O 92. Alternatively, a plurality of the remote I/Os 92 may be provided such that outputs of a plurality of the measurement circuits 34, corresponding to each of the remote I/Os 92, are inputted thereto.

An analog input from each of the measurement circuits 34 is converted into a data file in a predetermined form by the remote I/O 92. This data file includes information on a measurement result, i.e., includes measured temperature data, measured voltage data, and measured current data. The remote I/O 92 transmits the measured data to the controller 15 in the electric power device 11 through the communication cable 25. The measured data is relayed by the controller 15 to be further transmitted to the data processing unit 16.

Therefore, according to the present embodiment, the measurement results obtained by a large number of the measurement circuits 34 can be outputted to a common digital communication line through the remote I/O 92, thereby allowing the measurement results to be transmitted to the controller 15. Because it is not needed to provide an individual communication line for every measurement circuit 34, the number of the wirings in the battery inspection apparatus 10 can be reduced.

Further, the analog communication lines are ended around the measurement circuits 34 in the battery inspection table 12 and the communication line with the electric power device 11 is formed by a digital line, and hence it can be made that the digital communication line is hardly affected by a power line attached thereto. In the present embodiment, the power cable 24 particularly transmits relatively large intermediate outputs, as stated above. Accordingly, the digitalization of the communication cable 25 is highly effective as a measure against a noise occurring due to the power cable 24.

In one example, a transmission frequency of measured values whose temporal variations are relatively small (i.e., the values are not rapidly changed) may be made smaller than that of measured values whose temporal variations are relatively large, in the remote I/O 92. For example, a transmission frequency of temperature values may be smaller than that of voltage values or current values. With such a measure, a communication load can be reduced while an influence on the measurement accuracy is being suppressed.

In one example, the measurement circuits 34 and the remote I/O 92 may be formed on a single electronic substrate such that the measurement circuits 34 are connected to the remote I/O 92 by the wirings on the electronic substrate. With such a structure, the transmission channel for analog measured signals between the measurement circuit 34 and the remote I/O 92 can be shortened. Also, in the present embodiment, the measurement circuits 34 and the buck-boost converters 28 are both provided in the inspection table 12. Because the measurement circuits 34 and the buck-boost converters 28 are connected together in a closer state, in comparison with the case where the buck-boost converters 28 are built in the electric power device 11, a measurement error occurring due to a noise can be reduced.

Figure 5:
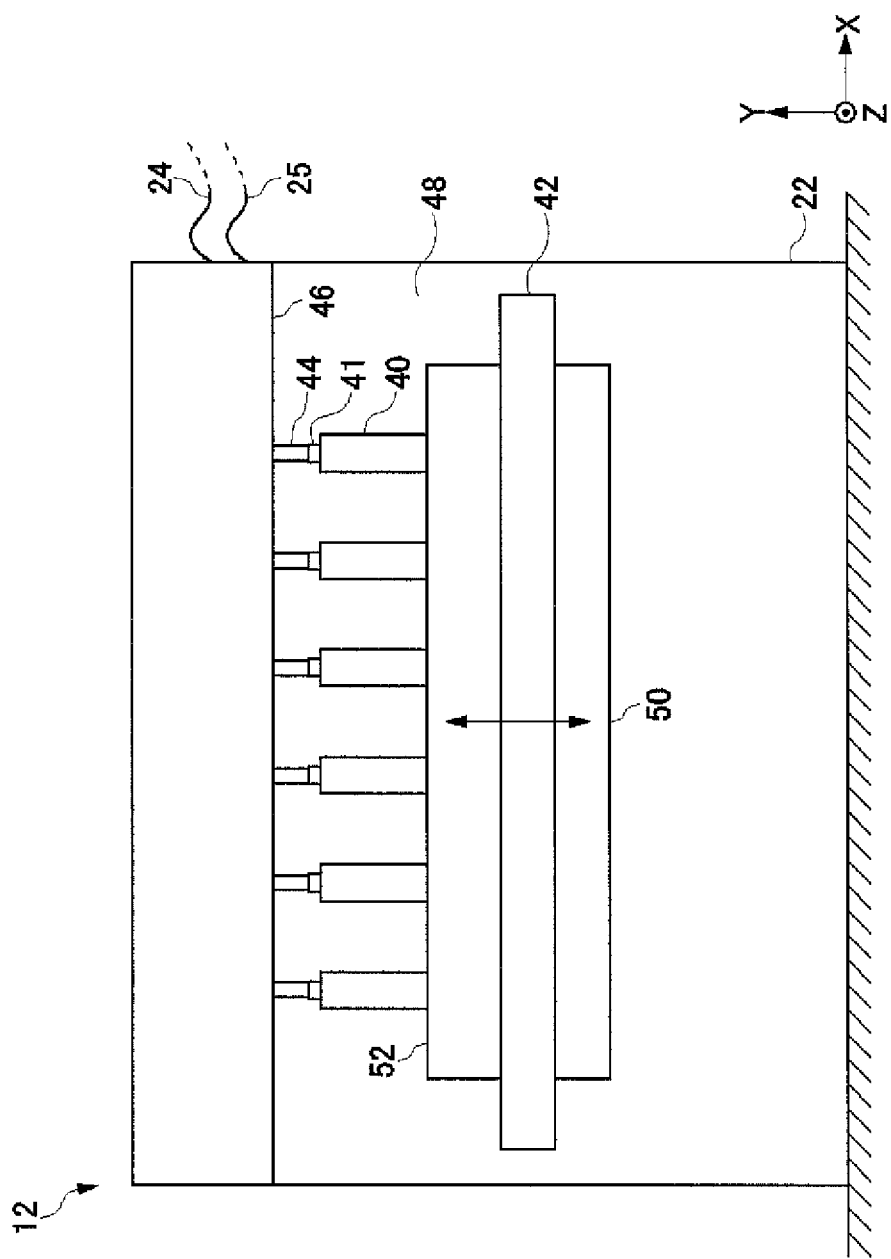
FIG. 5 is a view schematically illustrating the substantial portion of the battery inspection table according to an embodiment of the invention.
Figure 6:
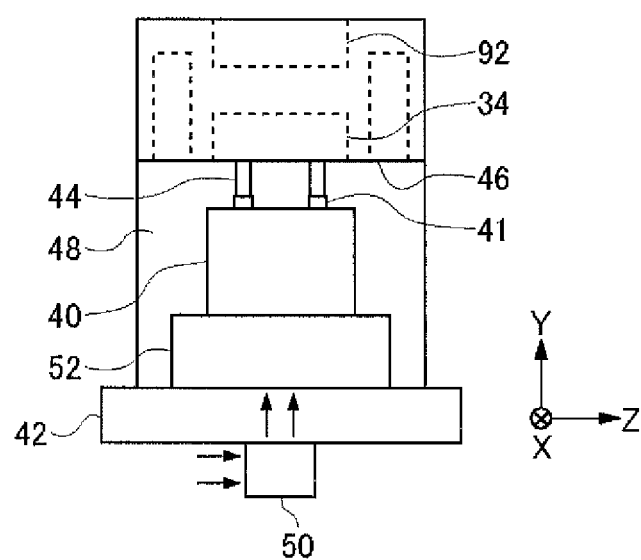
FIG. 6 is a view schematically illustrating the substantial portion of the battery inspection table according to an embodiment of the invention.

FIGS. 3 to 6 are views each illustrating a substantial portion of the battery inspection table 12 according to an embodiment of the present invention. FIGS. 3 and 4 are a front view and a side view, respectively, when batteries 40 are conveyed into for inspection (or conveyed out after inspection). FIGS. 5 and 6 are respectively a front view and a side view each illustrating a state during inspection. FIGS. 4 and 6 are views, when the substantial portion illustrated in FIGS. 3 and 5 is viewed from the side, respectively. For convenience of description, an XYZ orthogonal coordinate system is defined as illustrated. That is, it is assumed that a direction in which the batteries 40 are arrayed is the X-direction, the vertical direction is Y-direction, and a direction perpendicular to both the directions is the Z-direction.

As illustrated in FIGS. 3 to 6, the battery inspection table 12 is formed to include the battery supporting portion 42, the contactor 44, and the contactor supporting portion 46. They are housed in the case 22. In the illustrated example, the battery supporting portion 42 and the contactor supporting portion 46 face each other such that a battery array space 48 is formed between them. The battery supporting portion 42 is arranged downward in the vertical direction of the contactor supporting portion 46. A cross-flow fan 50 for adjusting the temperature of the battery 40 is attached below the battery supporting portion 42.

The battery 40 has: a first end surface having an electrode 41; a second end surface facing the first end surface; and a side surface connecting the first end surface and the second end surface. In the illustrated example, the battery 40 has a rectangular parallelepiped shape, and each of the batteries 40 is arrayed in the horizontal direction (X-direction), with the first end surface and the second end surface being located upward and downward, respectively, and with the side surfaces facing each other. The battery 40 is arrayed to be spaced apart from the adjacent battery 40. The side surface of the battery 40 is a surface parallel to the vertical direction (Y-direction). In the present example, the battery 40 is conveyed into the battery inspection table 12 for inspection and conveyed out, while being held on a pallet 52.

In FIG. 3, the arrow represents the direction in which the pallet 52 is conveyed into or out. The dashed lines represent position where the pallet 52 and the batteries mounted thereon are located when they are conveyed onto the battery supporting portion 42. The pallet 52 and the batteries 40 are conveyed into or out of the battery inspection table 12 by a non-illustrated pallet automatic conveyance device. Accordingly, part of the side wall of the battery inspection table 12 is formed as a door 54 that can be opened and closed. The door 54 is opened when the batteries 40 are conveyed into or out; while is closed when the batteries 40 are inspected. The battery array space 48 is partitioned from the external space during inspection by closing the door 54.

The battery supporting portion 42 is a supporting table on which a plurality of batteries to be inspected are mounted and supported. In the illustrated example, the battery supporting portion 42 supports the batteries 40 by supporting the pallet 52 on which the batteries 40 are mounted, instead of directly supporting the batteries 40. The battery supporting portion 42 is moved up and down by a vertically-moving mechanism (see FIG. 5). The batteries 40 are moved along with the pallet 52 by a movement of the battery supporting portion 42, thereby allowing the electrode 41 of the battery 40 to contact and leave the contactor 44.

As described later, a space is formed in the supporting table. This space may also be used as a baffle space for baffling an air flow that has been sent out of the cross-flow fan 50 and moves toward each of the batteries 40. In order to partition the space from outside, the supporting table may include: a battery supporting plate for supporting the batteries 40; an attaching plate for attaching the cross-flow fan 50; and a side surface plate for connecting the battery supporting plate and the attaching plate at the ends of both the plates.

The contactor 44 provides a voltage to each of the batteries 40 by contacting the electrode 41 of each of the batteries 40. Also, a contactor (not illustrated) for measuring the temperature, voltage, current, or the like, in the battery 40 is provided, as stated above. A plurality of the contactors 44 are provided in an array corresponding to that of the plurality of the batteries 40. The measurement circuits 34 each connected to each contactor 44 are also provided in an array corresponding to that of the plurality of the batteries 40. In the illustrated example, six batteries are arrayed in a line such that the side surfaces thereof face each other, and correspondingly to that, six sets of the contactors 44 and the measurement circuits 34 are similarly arrayed in a line. In one example, two electrodes 41 are provided in one battery 40, and two contactors 44 are provided correspondingly to that (see FIGS. 4 and 6).

Each of the contactors 44 and each of the measurement circuits 34 are supported by the contactor supporting portion 46. The contactor supporting portion 46 is, for example, a supporting plate for supporting the contactors 44 and the measurement circuits 34 and is provided so as to face the battery supporting portion 42. The measurement circuit 34 is provided on the rear surface side (in the illustrated example, on the upper side) of the contactor 44 so as to sandwich the contactor supporting portion 46. Each of the contactors 44 protrudes from this supporting plate toward the battery supporting portion 42. On the side opposite to the side going toward the battery supporting portion 42, a space for housing the aforementioned measurement circuits 34 and various electric components 56, such as the buck-boost units 17 and the remote I/O 92, is secured (see FIG. 4). The remote I/O 92 is provided on the side opposite to the side of the battery supporting portion 42 so as to sandwich the contactor 44, and the measurement circuit 34 is arranged between the contactor 44 and the remote I/O 92. The power cable 24 and the communication cable 25, which connect the battery inspection table 12 to the electric power device 11, extend from the side opposite to the side of the door 54 with respect to the X-direction.

Alternatively, the control board 90 may be arranged on the upper surface of the inspection table 12, as illustrated in FIG. 1. In some cases, the control board 90 may be arranged so as to be parallel to the measurement circuit 34, or may be attached to the contactor supporting portion 46 similarly to the measurement circuit 34.

As described later, this electric component-housing space may also be used as an exhaust space for discharging an air flow that has been discharged from the battery array space 48, with being partitioned from the battery array space 48 by the contactor supporting portion 46. This exhaust space is also partitioned from the external space similarly to the aforementioned baffle space and the battery array space 48. In one of other examples, the electric components 56, such as the buck-boost unit 17, may be exposed outside the case 22, instead of being housed in the electric component-housing space (see FIG. 2).

In the present example, the batteries 40 are arrayed in a line and six batteries 40 can be housed in the battery inspection table 12, as illustrated in FIGS. 4 and 6. The battery inspection apparatus 10 can also be formed such that a further larger number of (or a smaller number of) batteries are housed in the battery inspection table 12. For example, the number of the batteries in the array direction (X-direction) may be made larger, or the number of lines in each of which the batteries 40 are arrayed may be made two or more. Further, several battery inspection units, each including the battery supporting portion 42, the contactor 44, and the contactor supporting portion 46, may be stacked each other in the vertical direction. Thus, the number of the batteries, which can be inspected collectively, can be made large.

The battery array spaces 48 is formed for every battery array line, and the cross-flow fan 50 is also attached for every battery array line. The cross-flow fan 50 is arranged along the line in which the batteries 40 are arrayed. The cross-flow fan 50 is arranged in a state where the vent thereof faces the batteries 40, so that air is sucked-in from the horizontal direction (Z-direction) and blown upward (Y-direction) toward the batteries 40, as illustrated in FIG. 6. As illustrated, the length in the array direction of the cross-flow fan 50 is made larger than or equal to that of the array of the batteries 40. Thus, the fan can be provided immediately below each of the batteries, and hence air flow velocity distributions around the respective batteries can be made equal to each other. A plurality of the cross-flow fans 50 may be provided for a single battery array line, or a plurality of the battery array lines may share a single cross-flow fan 50.

A temperature adjustment fluid supply source according to an example of the present invention is not limited to a cross-flow fan. In stead of a cross-flow fan, a ventilator, such as, for example, a fan, circulator, blower, or the like, may be arranged along the array line of the batteries 40. In this case, the ventilator can be provided with an elongated vent extending in the battery array direction and the vent can be arranged to face each of the batteries. Alternatively, the uniformity of the flows may be enhanced by using a baffle plate between the vent and the battery. Thus, a substantially-uniform air flow velocity distribution can be provided to the channel between the batteries adjacent to each other. In still another example, a temperature adjustment fluid supply source may be formed so as to flow a temperature adjustment gas, other than ambient air, or a liquid along the surface of the battery.

It should be understood that the invention is not limited to the above-described embodiment, but may be modified into various forms on the basis of the spirit of the invention. Additionally, the modifications are included in the scope of the invention.

What is claimed is:

1. A battery inspection apparatus for use in a factory comprising:
    a battery inspection table that is installable in a room of the factory, the battery inspection table including a plurality of inspection units each for inspecting a rechargeable battery and a moving mechanism provided in the inspection table to cause a relative movement between the inspection units and the battery;
    an automatic conveyance system that is installable in the room of the factory to convey the battery to and from the moving mechanism of the battery inspection table; and
    a controller that is installable in another or the same room of the factory and provided separately from the battery inspection table, the controller configured to control the battery inspection table, wherein
    each of the inspection units includes: a contactor for inspection configured to contact a corresponding battery by the relative movement; and a measurement circuit that is connected to the contactor and configured to generate an analog measured signal by measuring at least one of a current, voltage, and temperature, based on an input from the contactor, and wherein
    the battery inspection table has at least one communication unit mounted therein, the communication unit being configured to convert the analog measured signal generated by each of the inspection units into a digital signal to output to a common digital communication line, and the digital communication line connects the communication units and the controller together.

2. The battery inspection apparatus according to claim 1, wherein
    the each of the inspection units includes mounting portions by each of which a mounting position of the battery is defined; and wherein
    the battery inspection table includes: an inspection stage on which the mounting portions are arrayed in a matrix in order to hold a large number of the batteries; and a contactor array in which the contactors are arrayed in an array corresponding to the matrix array of the mounting portions; and wherein
    the communication unit is provided at a position opposite to that of the inspection stage so as to sandwich the contactor array, and the measurement circuit is arranged between the contactor array and the communication unit.

3. The battery inspection apparatus according to claim 1, wherein
the battery inspection table includes a control board on which the communication unit and the measurement circuit are mounted.

4. The battery inspection apparatus according to claim 1, wherein
the communication unit converts a measurement result represented by an inputted analog measured signal into a data file, and transmits the data file to the controller through the digital communication line.

5. The battery inspection apparatus according to claim 1 further comprising an electric power device that is provided separately from the battery inspection table and configured to supply or collect power to or from the inspection units, wherein the controller is mounted in the electric power device; and wherein
the battery inspection table has a plurality of buck-boost converters mounted, each the plurality of the buck-boost converters being configured to adjust a voltage to be provided to the each of the plurality of the inspection units, and the plurality of the buck-boost converters are formed as a buck-boost unit connected to the electric power device through a common power line, and the buck-boost unit is connected to the controller through the communication unit and the digital communication line.

* * * * *